United States Patent
Chou et al.

(10) Patent No.: US 7,319,067 B2
(45) Date of Patent: Jan. 15, 2008

(54) METHOD OF SIMULTANEOUSLY CONTROLLING ADI-AEI CD DIFFERENCES OF OPENINGS HAVING DIFFERENT SIZES AND ETCHING PROCESS UTILIZING THE SAME METHOD

(75) Inventors: Pei-Yu Chou, Taipei County (TW); Jiunn-Hsing Liao, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 134 days.

(21) Appl. No.: 11/163,981

(22) Filed: Nov. 7, 2005

(65) Prior Publication Data

US 2007/0105322 A1    May 10, 2007

(51) Int. Cl.
*H01L 21/4763* (2006.01)
(52) U.S. Cl. ............ 438/637; 438/638; 438/640; 438/673; 257/E23.145
(58) Field of Classification Search ........ 438/618–681; 257/E23.145
See application file for complete search history.

(56) References Cited

U.S. PATENT DOCUMENTS 6,287,951 B1 *  9/2001  Lucas et al. ............... 438/618

* cited by examiner

*Primary Examiner*—H. Jey Tsai
(74) *Attorney, Agent, or Firm*—Jianq Chyun IP Office

(57) ABSTRACT

A method of simultaneously controlling the ADI-AEI CD differences of openings having different sizes is disclosed. The openings are formed by: forming an ARC and a photoresist layer with a first and a second opening patterns of different sizes therein on a material layer, and etching the ARC and the material layer with the photoresist layer as a mask to form in the material layer a first/second opening corresponding to the first/second opening pattern, wherein the etching recipe makes the first/second opening smaller than the first/second opening pattern by a first/second size difference ($\Delta S_1/\Delta S_2$) and the difference between $\Delta S_1$ and $\Delta S_2$ is a relative size difference. The method is characterized by that an etching parameter affecting the relative size difference is set at a first value in etching the ARC and at a second value different from the first value in etching the material layer.

25 Claims, 3 Drawing Sheets

METHOD OF SIMULTANEOUSLY CONTROLLING ADI-AEI CD DIFFERENCES OF OPENINGS HAVING DIFFERENT SIZES AND ETCHING PROCESS UTILIZING THE SAME METHOD

BACKGROUND OF THE INVENTION

1. Field of the Invention

The present invention relates to etching techniques. More particularly, the present invention relates to a method of simultaneously controlling the ADI-AEI CD differences of openings having different sizes, as well as to an etching process utilizing the same method. The ADI-AEI CD difference of an opening is defined hereinafter as the difference of the after-development-inspection critical dimension (ADI CD) and the after-etching-inspection critical dimension (AEI-CD) of the opening, and is sometimes simply called a "size difference" in the following descriptions.

2. Description of the Related Art

As the integration degree of IC devices is always required higher, the dimensions of semiconductor devices have to be reduced unceasingly. The most intuitive method to reduce the pattern size is to utilize high-resolution lithography, but the high-resolution techniques are difficult and costly to use due to the limitations in optics. Particularly, the ADI CD of an opening pattern is much more difficult to reduce with lithographic techniques only as compared with a line pattern of the same width. Therefore, the etching recipe of the subsequent opening-etching step using the opening pattern as a mask is usually adjusted to make the AEI CD relatively smaller than the ADI CD.

However, in the cases where the etching recipe is adjusted to reduce the AEI CDs of openings having different sizes, the ADI-AEI CD differences of the openings are difficult to control as required. For example, when the AEI CD of a square contact opening is reduced in a process of simultaneously forming a square contact for a source/drain (S/D) region and a larger share contact for a gate and an S/D region beside the gate, the AEI CD of the share contact opening is reduced more. When the AEI CD of a share contact opening is overly reduced, the share contact formed therein has an overly high resistance lowering the operation speed, or even disconnects with the target gate or S/D region to form a broken circuit. On the contrary, when the sizes of the two types of openings both are reduced insufficiently, misconnections may occur. Hence, the size differences of the two types of contact openings both have to be controlled suitably.

Similarly, in other kinds of opening processes where the AEI CDs of openings with different sizes have to be reduced simultaneously, the ADI-AEI CD differences of the openings have to be controlled simultaneously to meet the requirements.

SUMMARY OF THE INVENTION

In view of the foregoing, this invention provides a method of simultaneously controlling the ADI-AEI CD differences of openings having different sizes.

This invention also provides an etching process that utilizes the above method of this invention.

For the method of simultaneously controlling the ADI-AEI CD differences of openings having different sizes, the openings are formed with at least the following steps. An anti-reflection coating (ARC) and a patterned photoresist layer are formed on a material layer, wherein the photoresist layer has therein a first and a second opening patterns of different sizes. The photoresist layer is used as a mask to etch the ARC and the material layer to form, in the material layer, a first and a second openings respectively corresponding to the first and second opening patterns, wherein the recipe of the etching makes the first/second opening smaller than the first/second opening pattern by a first/second size difference ($\Delta S_1/\Delta S_2$), and the difference between $\Delta S_1$ and $\Delta S_2$ is a relative size difference. This method includes at least a step of setting an etching parameter affecting the relative size difference at a first value in etching the ARC and at a second value different from the first value in etching the material layer.

In certain embodiments of this invention, the above etching parameter may be temperature, a flow rate of an etching gas, or pressure.

In some embodiments, the size of the first opening pattern is larger than that of the second opening pattern. The first size difference may be larger than the second size difference, while in such a case, the first opening and the second opening may be a share contact opening and a square contact opening, respectively.

According to some embodiments, the relative size difference can be negatively correlated with the first value of the etching parameter. In such cases, the first value may be smaller than the second one to make a larger relative size difference, and the etching parameter may be the temperature. In addition, the ARC and the material layer may be etched in the same reaction chamber or in different reaction chambers.

The etching process of this invention includes the following step. A substrate on which a material layer, an ARC and a patterned photoresist layer have been formed sequentially is provided, wherein the photoresist layer has therein a first and a second opening patterns of different sizes. The photoresist layer is used as a mask to etch the ARC and the material layer to form in the material layer a first and a second openings respectively corresponding to the first and second opening patterns, wherein the recipe of the etching makes the first/second opening smaller than the first/second opening pattern by a first/second size difference ($\Delta S_1/\Delta S_2$), and the difference between $\Delta S_1$ and $\Delta S_2$ is a relative size difference. The process further includes a step of discovering, before the substrate is provided, an etching parameter negatively correlated with the relative size difference. In the etching process, the etching parameter is set at a first value in the step of etching the ARC to obtain a predetermined relative size difference.

The above etching parameter may be temperature, a flow rate of an etching gas, or pressure. Moreover, in the step of etching the material layer, the etching parameter may be set at a second value that is larger than the first value.

In some embodiments, the size of the first opening pattern is larger than that of the second opening pattern. The first size difference may be larger than the second one, while in such a case, the first opening and the second opening may be a share contact opening and a square contact opening, respectively. When the first and the second openings are respectively a share contact opening and a square contact opening, the etching parameter may be the temperature, and the first value may be set at about 20-30° C. In addition, the ARC and the material layer may be etched in the same reaction chamber or in different reaction chambers.

Accordingly, except using an etching recipe that makes the AEI CD smaller than the ADI CD, the method/process of this invention further adjusts an etching parameter affecting the relative size difference to control the relative size difference between the openings of different sizes, i.e., to fine adjust the ADI-AEI CD differences of the openings. Therefore, by applying this invention to a process of forming openings with different sizes, the ADI-AEI CD differences of the openings can be simultaneously controlled so that each opening has a small size that is difficult to achieve with the lithographic techniques only and is not overly small.

It is to be understood that both the foregoing general description and the following detailed description are exemplary, and are intended to provide further explanation of the invention as claimed.

DESCRIPTION OF THE PREFERRED EMBODIMENTS

The method/process will be further explained with a contact opening process as an example, which is not intended to restrict the scope of this invention. The contact opening process incorporates the above method and process of this invention for fabricating contact openings having different sizes, and is illustrated in FIGS. 1A-1F.

Figure 1A:
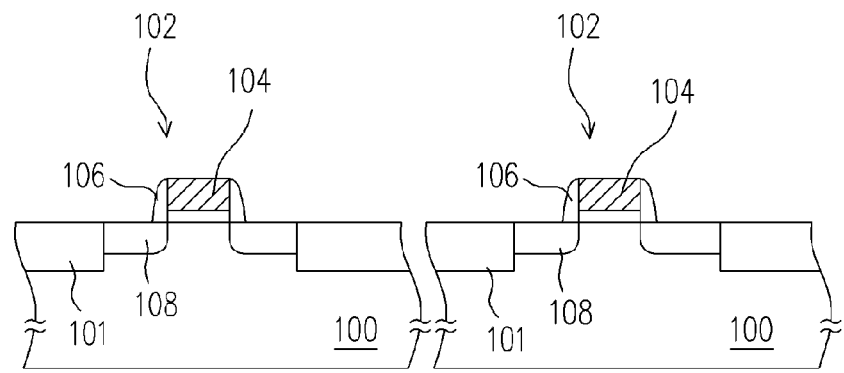
FIGS. 1A-1F illustrate a process flow of fabricating contact openings having different sizes according to a preferred embodiment of this invention, wherein the contact opening process incorporates the above method and process of this invention.

Referring to FIG. 1A, a substrate 100 is provided, which may have been formed with multiple MOS transistors 102 thereon. Each transistor 102 is separated from the adjacent transistors and/or other devices by an isolation structure 101, such as an STI structure. A gate structure 104 is disposed on the substrate 100, a spacer 106 is disposed on the sidewall of the gate structure 104, and two S/D regions 108 are located in the substrate 100 beside the gate structure 104. In an embodiment, a metal silicide (e.g., NiSi, WSi or CoSi) layer can be further formed on the gate structure 104 and the S/D regions 108 to lower their electrical resistances. Possible materials and forming methods of all parts of the MOS transistor 102 are well known and not described here.

Figure 1B:
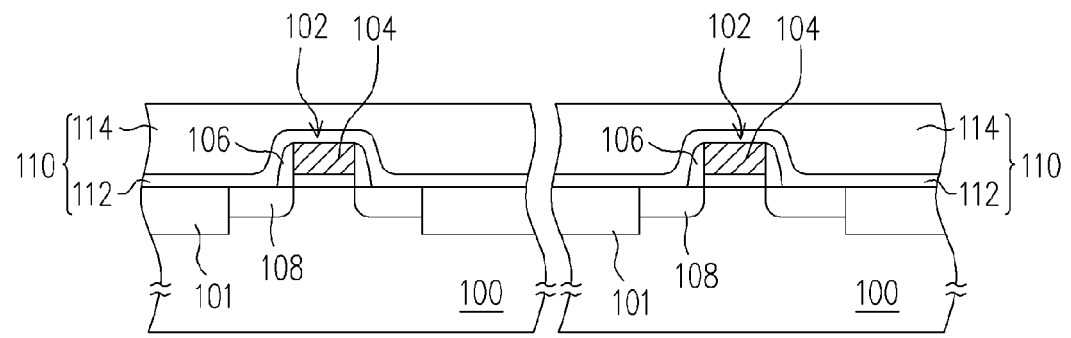

Referring to FIG. 1B, a dielectric layer 110 is formed over the substrate 100 to covering the transistors 102 and the isolation structure 101. The dielectric layer 110 may include an undoped silicate glass (USG) layer 112 and a phosphosilicate glass (PSG) layer 114, each of which may be formed through CVD. In one embodiment, an etching stop layer, such as a SiN layer formed through CVD, is formed over the substrate 100 before the dielectric layer 110 is formed.

Figure 1C:
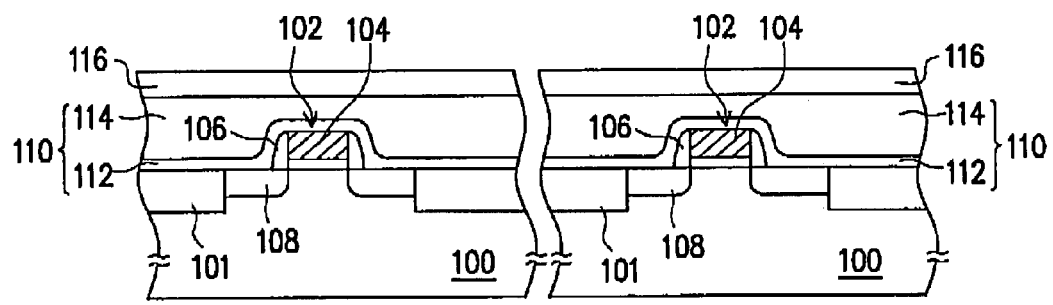

Referring to FIG. 1C, an ARC 116 is formed on the dielectric layer 110. The ARC 116 may be a dielectric ARC (DARC) like a silicon oxynitride (SiON) layer, an inorganic ARC or an organic ARC, which can be formed through CVD or any other suitable method. The ARC 116 is formed to inhibit reflection and interference of the exposure light in the later lithography process and improve the pattern quality.

Figure 1D:
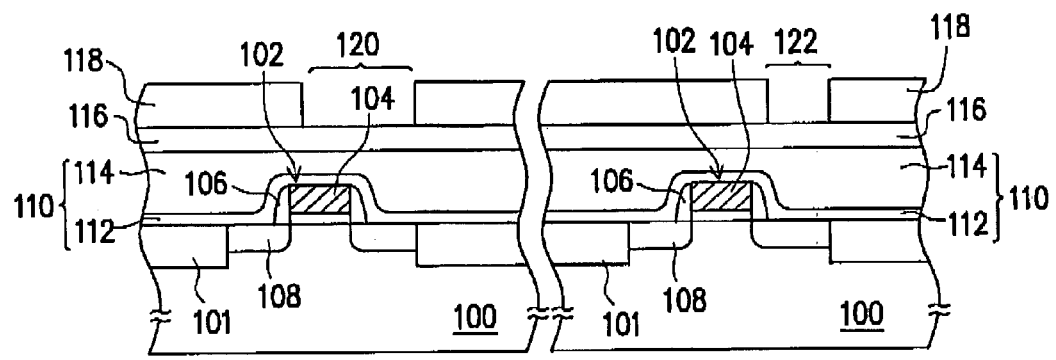

Referring to FIG. 1D, a patterned photoresist layer 118 is formed on the ARC 116. The patterned photoresist layer 118 has therein a larger share contact opening pattern 120 and a smaller square contact opening pattern 122 exposing portions of the ARC 116, wherein the share contact opening pattern 120 is located over a portion of the gate structure 104 and a portion of an S/D region 108 of a MOS transistor 102 and the square contact opening pattern 122 over merely a portion of an S/D region 108 of another MOS transistor 102.

The size of the share/square contact opening pattern 120/122 is namely the ADI CD of the share/square contact opening.

Figure 1E:
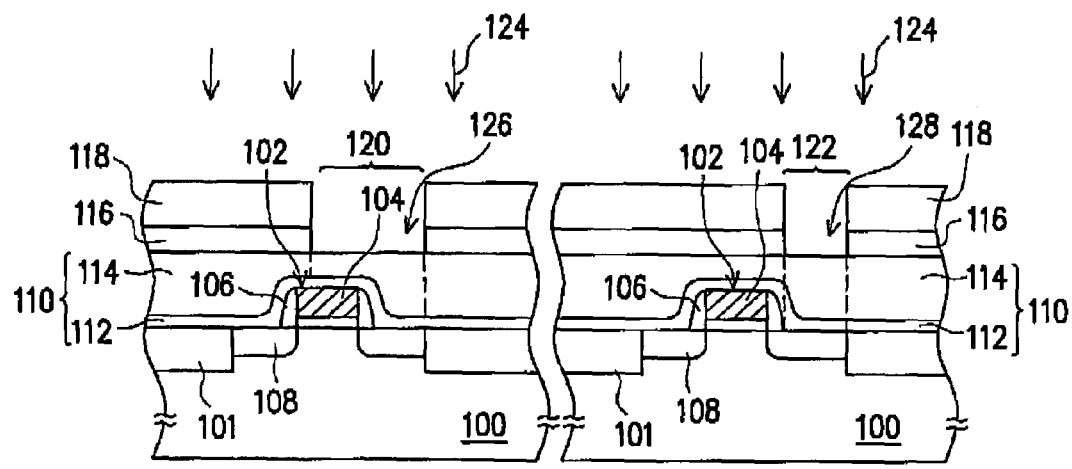

Referring to FIG. 1E, an etching step 124 is conducted using the photoresist layer as a mask to form, in the portions of the ARC 116 in the contact opening patterns 120 and 122, to form an opening 126 and an opening 128 respectively corresponding to the share contact opening pattern 120 and the square contact opening pattern 122. The etching recipe used in the etching step 124 makes the opening 126/128 smaller than the share/square contact opening pattern 120/122, and makes the difference between the size of the opening 126 and that of the share contact opening pattern 120 larger than the difference between the size of the opening 128 and that of the square contact opening pattern 122.

Figure 1F:
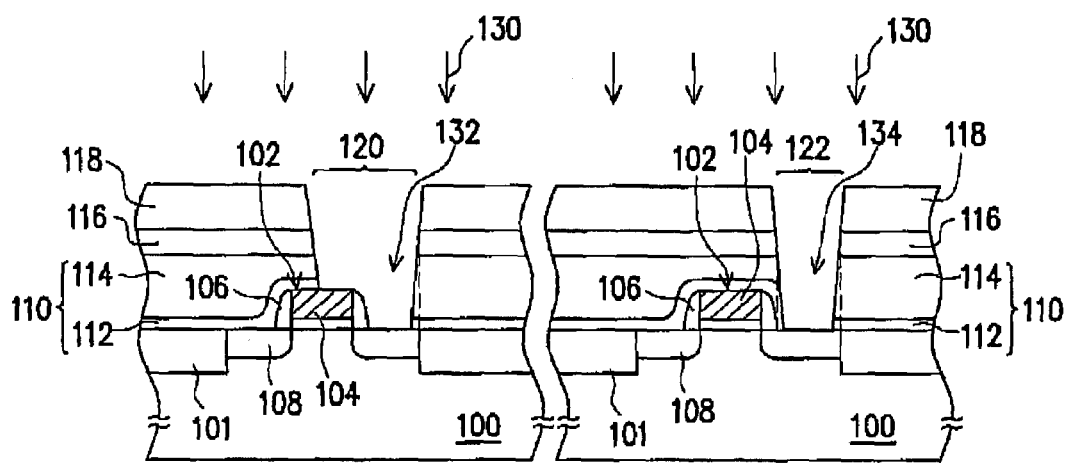

Referring to FIG. 1F, an etching step 130 is conducted, using the photoresist layer 118 and the portions of the ARC 116 in the contact opening patterns 120 and 122 as a mask, to form a share contact opening 132 exposing a portion of the gate structure 104 and a portion of an S/D region 108 of a transistor 102 as well as a square contact opening 134 exposing a portion of an S/D region 108 of another transistor 102. The size (=AEI CD) of the share/square contact opening 132/134 is smaller than the size (=ADI CD) of the share/square contact opening pattern 120/122 by a first/second size difference ($\Delta S_1/\Delta S_2$), and the difference between $\Delta S_1$ and $\Delta S_2$ is the above-mentioned relative size difference. In addition, the etching step 130 can be conducted in-situ after the etching step 124, i.e., in the same reaction chamber for conducting the etching step 124. The etching steps 124 and 130 may alternatively be conducted in different reaction chambers, if required.

In the above process, the relative size difference is controlled with an etching parameter in the ARC etching step 124 that can affect the relative size difference, wherein the etching parameter can be one positively or negatively correlated with the relative size difference and may be discovered based on a correlation table of all etching parameters with respect to the relative size difference that was previously acquired from a series of experiments. When the etching parameter is one negatively correlated with the relative size difference, such as temperature, a flow rate of etching gas or pressure, the relative size difference decreases/increases with an increase/decrease in the value of the etching parameter. In other words, the etching parameter should be decreased/increased when a larger/smaller relative size difference is required in such a case.

Moreover, when an etching parameter negatively correlated with the relative size difference is selected for controlling the relative size difference, the value of the etching parameter set in the ARC etching step 124 can be smaller than that set in the etching step 130 to form a larger relative size difference, i.e., to make the size changes of the share contact opening and the square contact opening more inconsistent.

When the temperature is selected as an etching parameter negatively correlated with the relative size difference to adjust the relative size difference, the recipe of the etching step 124 may include an etching gas of $CF_4$ with a flow rate of about 100 sccm, a pressure of about 75 mTorr, a power of 500-600 W and a temperature range of about 20-30° C. In real practice, the temperature can be set at a constant value between 20° C. and 30° C. The recipe of the etching step 130 may include an etching gas being a mixed gas of $CHF_3$ and $CH_2F_2$ or a mixed gas of $CH_3F$ and Ar or $O_2$, a pressure of about 50 mTorr, a power of 1500-3000 W, and a temperature of about 40° C., which is higher than 20-30° C. set in the ARC etching step 124.

After the share contact opening 132 and the square contact opening 134 are formed, subsequent processes can be done to form a share contact and a square contact (not shown). For example, the contacts can be formed by removing the photoresist layer 118 and the ARC 116, filling a conductive material into the openings 132 and 134 and then removing the conductive material outside the openings 132 and 134.

EXAMPLE

This invention is further explained with the following example, which is either not intended to restrict the scope of this invention. The ARC etching step was done at 20° C., 25° C. and 30° C., respectively, in three experiments, and the temperature in the dielectric etching step was fixed at 40° C. in the three experiments. In each experiment, the AEI CD and ADI CD of each of the share contact opening and the square contact opening were measured after the etching step 126, and the difference (ΔS) between the AEI CD and the ADI CD was calculated. The difference between the size difference of the share contact opening and that of the square contact opening is then calculated as a relative size difference "Δ (ΔS)". The results are shown in Table 1.

TABLE 1

| | Temperature (° C.) in etching step 124/130 | CD (nm) | Share contact | Square contact |
|---|---|---|---|---|
| 1 | 20° C./40° C. | ADI CD | 210.6 | 108.6 |
| | | AEI CD | 152.2 | 74.9 |
| | | ΔS | −58.4 | −33.7 |
| | | Δ (ΔS) | 24.7 | |
| 2 | 25° C./40° C. | ADI CD | 212.3 | 109.7 |
| | | AEI CD | 161.5 | 77.5 |
| | | ΔS | −50.8 | −32.2 |
| | | Δ (ΔS) | 18.6 | |
| 3 | 30° C./40° C. | ADI CD | 210.5 | 107.6 |
| | | AEI CD | 162.2 | 76.7 |
| | | ΔS | −48.3 | −30.9 |
| | | Δ (ΔS) | 17.4 | |

According to Table 1, the AEI CD is always smaller than the ADI CD for both of the share contact opening and the square contact opening. When the temperature in the ARC etching step 124 is raised from 20° C. to 30° C., the relative size difference is decreased from 24.7 nm to 17.4 nm, which confirms that the relative size difference is negatively correlated with the temperature. Hence, when the relative size difference is to be increased/decreased, i.e., when the size difference of the share contact opening is to be increased/decreased with that of the square contact opening almost unchanged, the ARC etching temperature should be lowered/raised.

Accordingly, by applying the present invention to a process of forming contact openings with different sizes, each contact opening can have a small size that is difficult to achieve with lithographic techniques only and is not overly small. Consequently, the contacts later formed in the contact openings will not cause a misconnection, high electrical resistance or disconnection problem, thereby greatly improving the reliability of the product.

In summary, except using an etching recipe that makes the AEI CD smaller than the ADI CD, the method of this invention further adjusts an etching parameter affecting the relative size difference to control the relative size difference between the openings of different sizes, i.e., to fine control the ADI-AEI CD differences of the openings, so that each opening is formed with a suitable size.

It will be apparent to those skilled in the art that various modifications and variations can be made to the structure of the present invention without departing from the scope or spirit of the invention. In view of the foregoing, it is intended that the present invention covers modifications and variations of this invention.

What is claimed is:

1. A method of simultaneously controlling ADI-AEI CD differences of openings having different sizes, wherein the openings are formed with the steps comprising:

forming an anti-reflection coating (ARC) and a patterned photoresist layer on a material layer, wherein the patterned photoresist layer has therein a first opening pattern and a second opening pattern of different sizes; and using the photoresist layer as a mask to sequentially etch the ARC and the material layer to form, in the material layer, a first opening and a second opening respectively corresponding to the first and the second opening patterns, wherein a recipe of the etching makes the first opening smaller than the first opening pattern by a first size difference and makes the second opening smaller than the second opening pattern by a second size difference, and a difference between the first and the second size differences is a relative size difference, the method comprising:

setting an etching parameter affecting the relative size difference at a first value in etching the ARC and at a second value different from the first value in etching the material layer.

2. The method of claim 1, wherein the etching parameter is temperature, a flow rate of an etching gas, or pressure.

3. The method of claim 1, wherein a size of the first opening pattern is larger than a size of the second opening pattern.

4. The method of claim 3, wherein the first size difference is larger than the second size difference.

5. The method of claim 4, wherein the first opening is a share contact opening and the second opening is a square contact opening.

6. The method of claim 1, wherein the relative size difference is negatively correlated with the first value of the etching parameter.

7. The method of claim 6, wherein the first value is smaller than the second value.

8. The method of claim 7, wherein the etching parameter is temperature.

9. The method of claim 1, wherein the ARC and the material layer are etched in the same reaction chamber.

10. The method of claim 1, wherein the ARC and the material layer are etched in different reaction chambers.

11. An etching process, comprising:

providing a substrate on which a material layer, an anti-reflection coating (ARC) and a patterned photoresist layer have been formed sequentially, wherein the patterned photoresist layer has therein a first opening pattern and a second opening pattern of different sizes; and using the photoresist layer as a mask to sequentially etch the ARC and the material layer to form, in the material layer, a first opening and a second opening respectively corresponding to the first and the second opening patterns, wherein a recipe of the etching makes the first opening smaller than the first opening pattern by a first size difference and makes the second opening smaller than the second opening pattern by a second size difference, and a difference between the first and the second size differences is a relative size difference, and further comprising:

discovering, before the substrate is provided, an etching parameter negatively correlated with the relative size difference, wherein the etching parameter is set at a first value in the step of etching the ARC to obtain a predetermined relative size difference.

12. The method of claim 11, wherein the etching parameter is temperature, a flow rate of an etching gas, or pressure.

13. The method of claim 11, wherein in the step of etching the material layer, the etching parameter is set at a second value larger than the first value.

14. The method of claim 11, wherein a size of the first opening pattern is larger than a size of the second opening pattern.

15. The method of claim 14, wherein the first size difference is larger than the second size difference.

16. The method of claim 15, wherein the first opening is a share contact opening and the second opening is a square contact opening.

17. The method of claim 16, wherein the etching parameter is temperature.

18. The method of claim 17, wherein the first value is set at about 20-30° C.

19. The method of claim 11, wherein the ARC and the material layer are etched in the same reaction chambers.

20. The method of claim 11, wherein the ARC and the material layer are etched in different reaction chambers.

21. A method of simultaneously controlling ADI-AEI CD differences of openings having different sizes, comprising:

providing a substrate on which a material layer, an anti-reflection coating (ARC) and a patterned photoresist layer have been formed sequentially, wherein the patterned photoresist layer has opening patterns of different sizes;

using the patterned photoresist layer as a mask, etching the ARC at a first temperature;

etching the material layer at a second temperature to form the openings corresponding to the opening patterns, wherein the first temperature is different to the second temperature and the first temperature is set at a value to obtain a predetermined relative size difference between the ADI-AEI CD differences of the openings.

22. The method of claim 21, wherein the first temperature is lower than the second temperature.

23. The method of claim 21, wherein the openings include at least a share contact opening and a square contact opening.

24. The method of claim 21, wherein the value of the first temperature is negatively correlated with the relative size difference.

25. The method of claim 22, wherein the value of the first temperature is set at about 20-30°C.

* * * * *